United States Patent
Majumder et al.

(10) Patent No.: US 7,683,683 B1
(45) Date of Patent: Mar. 23, 2010

(54) FREQUENCY DOUBLER WITH DUTY-CYCLE CORRECTION AND ASSOCIATED METHODS

(75) Inventors: Amit K. Majumder, Lawrenceville, GA (US); Thomas P. Smutek, Colorado Springs, CO (US)

(73) Assignee: Marvell International Ltd., Hamilton (BM)

(*) Notice: Subject to any disclaimer, the term of this patent is extended or adjusted under 35 U.S.C. 154(b) by 0 days.

(21) Appl. No.: 12/186,898

(22) Filed: Aug. 6, 2008

Related U.S. Application Data

(60) Provisional application No. 60/954,130, filed on Aug. 6, 2007, provisional application No. 60/956,255, filed on Aug. 16, 2007, provisional application No. 60/957,310, filed on Aug. 22, 2007.

(51) Int. Cl.
*H03B 19/00* (2006.01)

(52) U.S. Cl. ....... 327/122; 327/175

(58) Field of Classification Search ......... 327/122, 327/175
See application file for complete search history.

(56) References Cited

U.S. PATENT DOCUMENTS

| | | | |
|---|---|---|---|
| 6,718,477 B1 * | 4/2004 | Plants et al. | 713/500 |
| 6,967,508 B2 * | 11/2005 | Zhou et al. | 327/122 |
| 7,173,464 B2 * | 2/2007 | Nagasue | 327/175 |

\* cited by examiner

*Primary Examiner*—Lincoln Donovan
*Assistant Examiner*—William Hernandez

(57) ABSTRACT

An apparatus includes a controllable delay circuit, a clock doubler circuit, a low-pass filter, and a comparator. The controllable delay circuit generates a delayed clock signal from a reference clock signal. The clock doubler circuit generates an output clock signal from the delayed clock signal. A frequency of the output clock signal is twice a frequency of the reference clock signal. The low-pass filter receives the output clock signal and generates a filtered signal. The comparator generates an output signal by comparing the filtered signal with a reference signal.

35 Claims, 10 Drawing Sheets

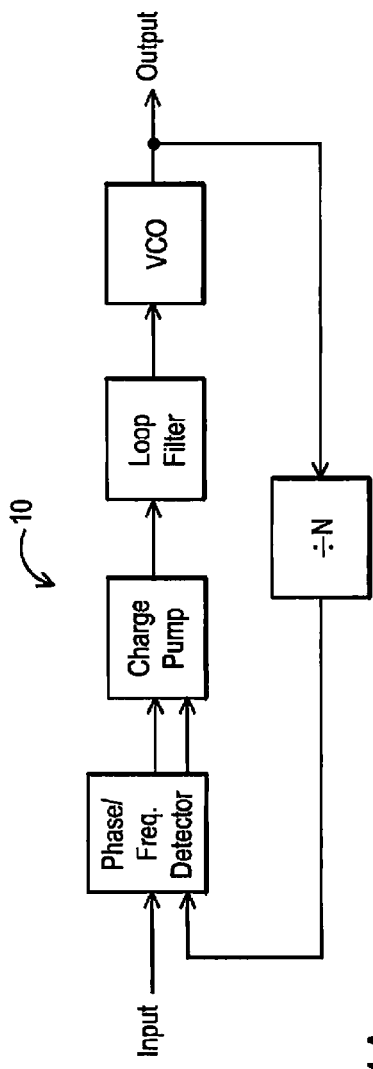
FIG. 1A - PRIOR ART
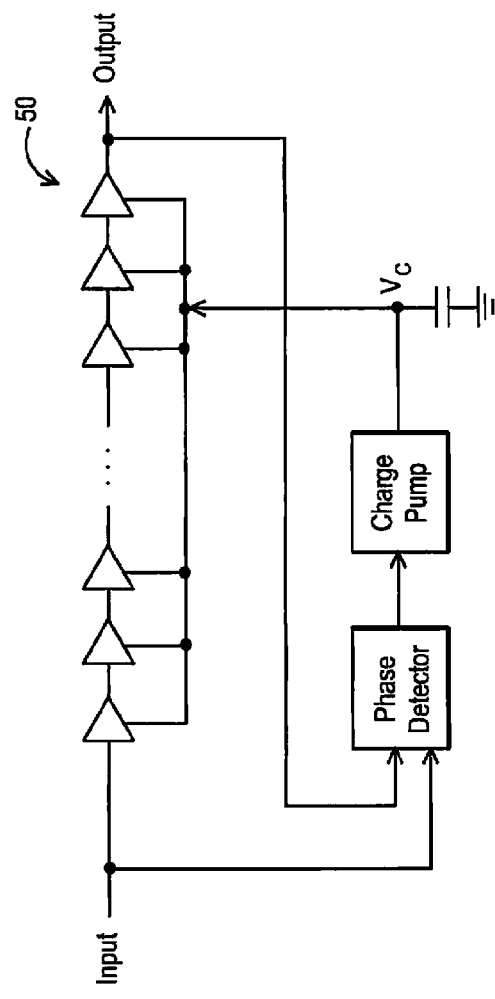
FIG. 1B - PRIOR ART

FREQUENCY DOUBLER WITH DUTY-CYCLE CORRECTION AND ASSOCIATED METHODS

CROSS-REFERENCE TO RELATED APPLICATIONS

This patent application claims priority to, and incorporates by reference, U.S. Provisional Patent Application Ser. No. 60/954,130, filed on Aug. 6, 2007, titled "Clock Doubler With Duty-Cycle Correction;" U.S. Provisional Patent Application Ser. No. 60/956,255, filed on Aug. 16, 2007, titled "Efficient Clock Doubler With Duty-Cycle Correction;" and U.S. Provisional Patent Application Ser. No. 60/957,310, filed on Aug. 22, 2007, titled "Input-Decoupled Efficient Clock Doubler With Duty-Cycle Correction."

TECHNICAL FIELD

The disclosed concepts relate generally to generating electronic signals and, more particularly, to apparatus and associated methods for doubling the frequency of a signal.

BACKGROUND

Modern electronic circuits and systems use and process signals of increasing frequencies. For example, processors, such as microprocessors, microcontrollers, and digital signal processors, use relatively high clock frequencies. Other circuits and integrated circuits (ICs) commonly use high-frequency signals as reference or clock signals. Yet other circuits may seek to increase the frequency of a given signal by, for example, doubling its frequency.

Because of the relatively high frequencies involved, however, circuit board traces, connectors, wires, sockets, IC pads and bonding wires, etc., may impose unacceptably high parasitic impedances in the path of high-frequency signals. As a result, designers often provide high-frequency signals, such as clock signals, on-chip or locally, as needed, by using a reference signal of a lower frequency.

FIGS. 1A and 1B show two conventional ways of doubling a clock frequency. FIG. 1A illustrates a circuit 10 for doubling a clock frequency by using a phase-locked loop (PLL), whereas circuit 50 in FIG. 1B uses a delay-locked loop (DLL). The details of the circuitry and operation of the circuits in FIGS. 1A and 1B fall within the knowledge of persons of ordinary skill in the art.

SUMMARY

The disclosed concepts relate generally to generating electronic signals for use in electronic circuits and systems. More specifically, the disclosed concepts relate to generating electronic signals, such as clock or reference signals, or a signal of higher frequency derived from a signal of lower frequency, and associated methods. In one exemplary embodiment, an apparatus includes a controllable delay circuit, and a clock doubler circuit. The controllable delay circuit generates a delayed clock signal from a reference clock signal. The clock doubler circuit generates an output clock signal from the delayed clock signal. The frequency of the output clock signal is twice the frequency of the reference clock signal.

In another exemplary embodiment, an apparatus includes a frequency doubler circuit. The frequency doubler circuit includes a controllable delay circuit, a clock doubler circuit, and a charge pump. The frequency doubler circuit generates a delayed clock signal from an input clock signal. The clock doubler circuit generates an output clock signal from the delayed clock signal. The charge pump provides a feedback signal to the controllable delay circuit in response to the delayed clock signal The output clock signal has a frequency that is twice the frequency of the input clock signal.

In yet another exemplary embodiment, a method of generating an output clock signal from a reference clock signal includes delaying the reference clock signal to generate a delayed clock signal, and generating the output clock signal by using the delayed clock signal in a negative feedback loop. The frequency of the output clock signal is twice the frequency of the reference clock signal.

BRIEF DESCRIPTION OF THE DRAWINGS

The appended drawings illustrate only exemplary embodiments and therefore should not be considered as limiting its scope. Persons of ordinary skill in the art who have the benefit of this disclosure appreciate that the disclosed concepts lend themselves to other equally effective embodiments. In the drawings, the same numeral designators used in more than one drawing denote the same, similar, or equivalent functionality, components, or blocks.

FIGS. 1A and 1B illustrates conventional circuitry for processing clock signals.

DETAILED DESCRIPTION

As noted above, the disclosed concepts relate generally to generating electronic signals for use in electronic circuits and systems. More specifically, the disclosed concepts relate to generating electronic signals, such as clock or reference signals, or a signal of higher frequency derived from a signal of lower frequency, and associated methods. Although the description provided refers to clock signals, persons of ordinary skill in the art who have the benefit of the description of the disclosed concepts understand that one may use the disclosed concepts to generate electrical signals for other uses or applications, as desired.

Compared to conventional solutions, the disclosed concepts provide several advantages. For example, the disclosed concepts allow clock doubler circuits that have a smaller chip area, consume less power, provide duty-cycle correction, and provide circuit stability over process, temperature, and voltage (PVT) variations.

One may use the disclosed concepts in a variety of systems and circuits, as persons of ordinary skill in the art who have the benefit of the description of the disclosed concepts understand. Examples include communication and application processors, typically used in communication systems.

Figure 2:
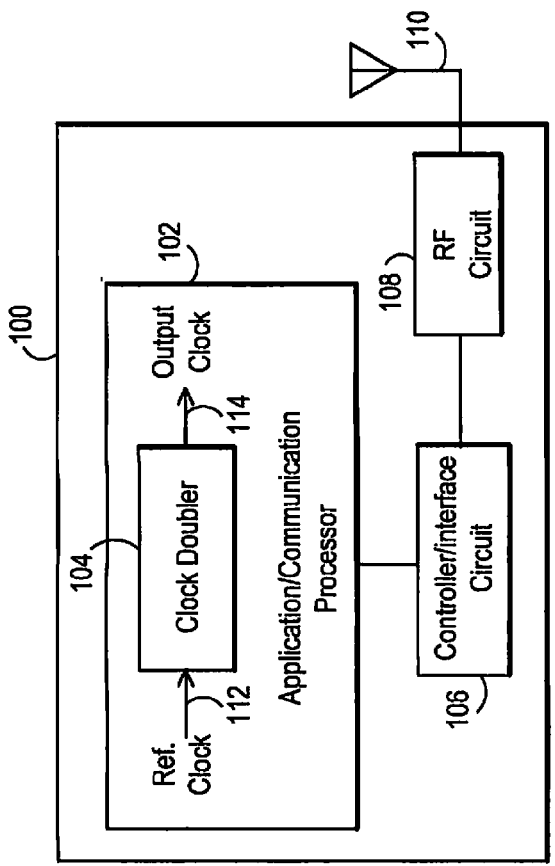
FIG. 2 illustrates a simplified block diagram of a communication apparatus that uses a clock-doubler according to the disclosed concepts.

FIG. 2 illustrates a simplified block diagram of a communication apparatus that uses a clock-doubler according to the disclosed concepts. More specifically, communication apparatus 100 includes an application/communication processor 102, controller/interface circuit 106, and radio-frequency (RF) circuit 108 (e.g., receiver, transmitter, transceiver) 108. RF circuit 108 communicates with other RF apparatus via antenna 110.

Application/communication processor 102 may perform various control, signal processing, and/or computing functions, as desired. Application/communication processor 102 includes clock doubler circuit 104 according to the disclosed concepts. Clock doubler 104 receives a reference or input clock signal 112, and provides an output clock 114.

More specifically, clock doubler 104 doubles the frequency of reference clock 112. In other words, output clock 114 has twice the frequency of reference clock 112. In addition, clock doubler 104 corrects the duty-cycle of reference clock 112. Generally speaking, reference clock 112 often has a duty-cycle that deviates from 50%. Clock doubler 104 corrects the duty cycle of output clock 114 so that it has a duty-cycle equal to or substantially or nearly equal to 50% or other desired values.

Figure 3:
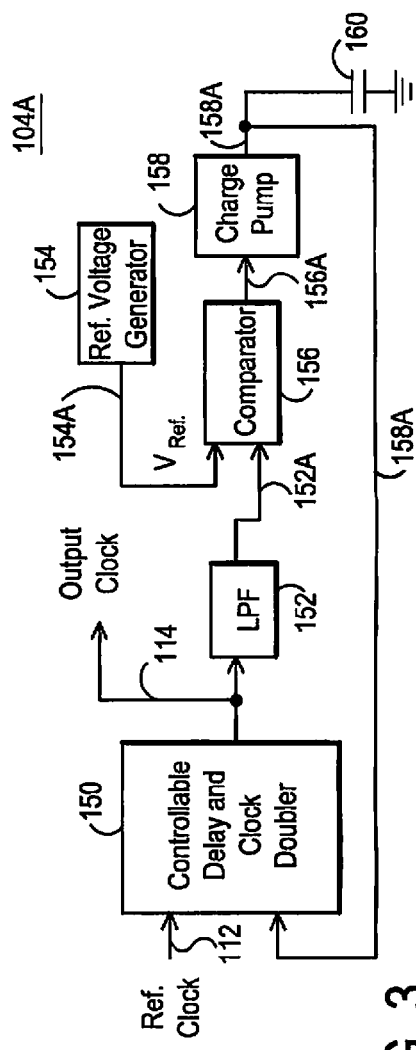
FIG. 3 depicts a simplified block diagram of a clock doubler according to an exemplary embodiment.

FIG. 3 shows a simplified block diagram of a clock doubler 104A according to an exemplary embodiment. Clock doubler 104A includes controllable delay and clock doubler 150, low-pass filter (LPF) 152, comparator 156, reference-voltage generator 154, charge pump 158, and capacitor 160.

As an examination of FIG. 3 shows, the exemplary embodiment has a relatively few circuit blocks and components. As a result, it occupies a smaller chip area, consumes less power, and provides improved duty-cycle performance. In simulations, an exemplary embodiment based on FIG. 3 and configured to correct duty cycle to 50% provided a 90-degree phase margin, evidencing stability of the feedback loop. Furthermore, the embodiment provided duty-cycle performance of 50%±4% (i.e., about 50% or substantially 50%).

Controllable delay and clock doubler 150, LPF 152, comparator 156, and charge pump 158 operate in a negative-feedback loop. The feedback loop provides the capability for clock doubler 104A to correct the duty cycle of output clock 114 to 50% or about 50% (or other desired values). Note, however, that by using the disclosed concepts, one may correct the duty cycle of output clock 114 to values other than 50%, as desired, by varying the output signal 154A of reference-voltage generator 154.

In response to reference clock 112 and output signal 158A of charge pump 158, controllable delay and clock doubler 150 generates output clock 114. Output clock 114 has double the frequency of reference clock 112, and a corrected duty cycle (50% or about 50%, or other desired value). Output clock 114 drives LPF 152. LPF 152 performs low-pass filtering of output clock 114, and generates filtered signal 152A. In exemplary embodiments, LPF 152 has a bandwidth of about 1/10 of the frequency of output clock 114.

Comparator 156 compares filtered signal 152A with reference signal 154A. In exemplary embodiments, reference-voltage generator 154 generates a reference signal 154A that has half the voltage of the supply voltage, e.g., $V_{CC}/2$, although one may use other values, as persons of ordinary skill in the art who have the benefit of the description of the disclosed concepts understand. As a result of the comparison, comparator 156 generates error signal 156A.

Under equilibrium conditions (i.e., when output clock 114 has a duty cycle of 50% or other desired value), error signal 156A has a value of zero. If, however, the duty cycle of output clock 114 deviates from 50% (or other desired value), error signal 156A has a finite value. In that scenario, the magnitude of error signal 156A depends on the amount of deviation of output clock 114 from 50% or other desired value (i.e., the amount of duty-cycle correction).

Error signal 156A drives charge pump 158A. In response, charge pump 158 generates control signal 158A. Control signal 158A charges or discharges capacitor 160, depending on whether the duty cycle of output clock 114 is less than or greater than 50% (or other desired value).

Specifically, in response to the voltage present across capacitor 160, controllable delay and clock doubler 150 generates a delayed version of reference clock 112. The amount of delay depends on the magnitude of control signal 158A. Put another way, variations in control signal 158A cause changes in the amount of delay produced by controllable delay and clock doubler 150. Because of the application of negative feedback, controllable delay and clock doubler 150 the amount of delay that causes correction of the duty cycle of output clock 114.

Figure 4:
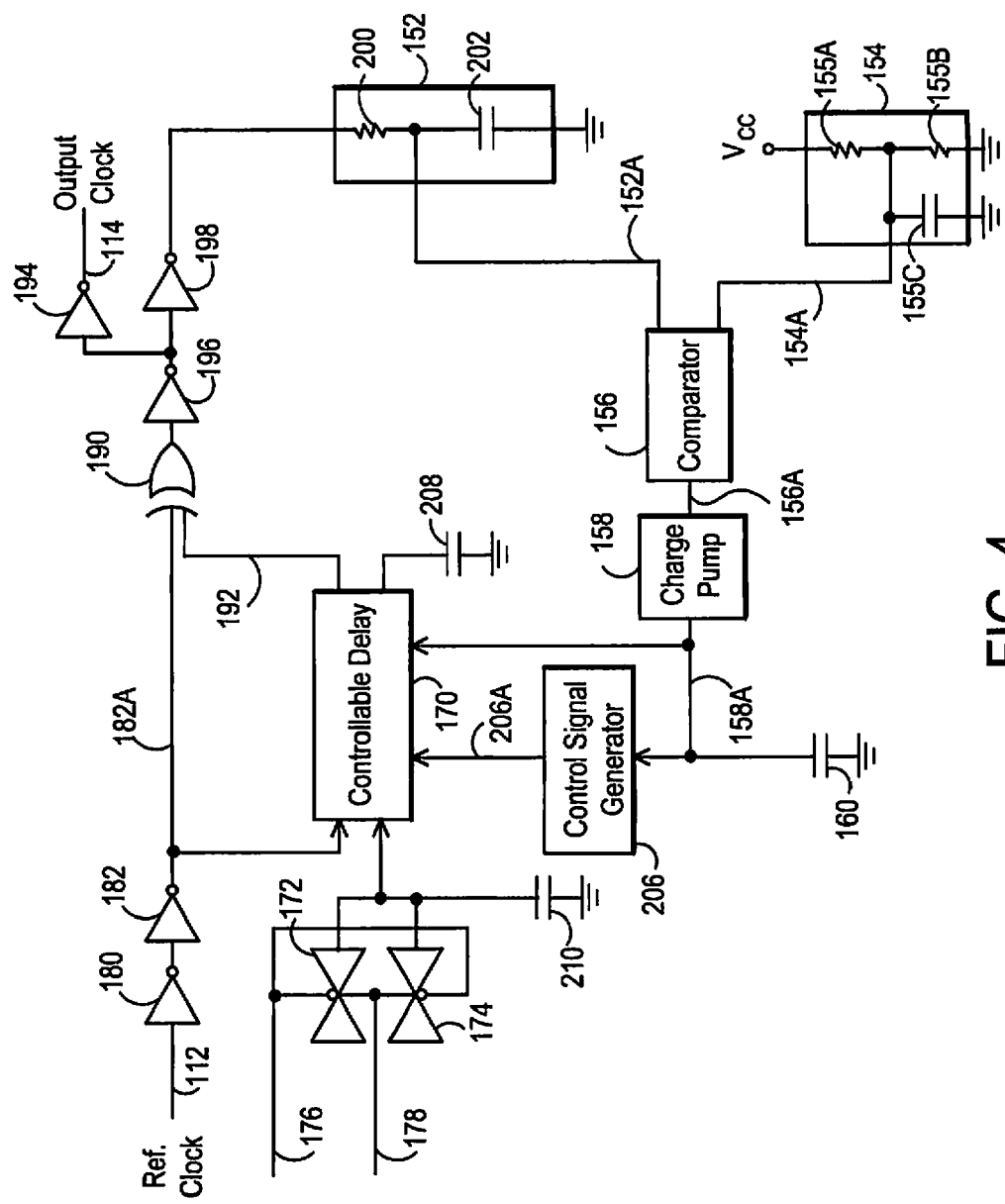
FIG. 4 shows a more detailed schematic of a clock doubler according to an exemplary embodiment.

FIG. 4 shows more details of a clock doubler according to an exemplary embodiment. Specifically, FIG. 4 provides more details of the circuitry of clock doubler 104A.

The clock doubler in FIG. 4 includes controllable delay 170, exclusive-OR (XOR) gate 190, LPF 152, reference-voltage generator 154, comparator 156, charge pump 158, and control signal generator 206. In addition, the clock doubler includes a number of inverters (labeled as 180, 182, 194, 196, and 198) that provide buffering and inversion for various signals.

Controllable delay 170 (described below in detail) accepts a buffered version (i.e., the output signal 182A of inverter 182) of reference clock 112. As described above, controllable delay 170 provides a delayed version of signal 182A (i.e., of reference clock 112), and provides that delayed version as output signal 192. Also as noted above, the amount of delay depends on a control signal in the negative feedback loop that includes controllable delay 170, XOR gate 190, LPF 152, comparator 156, and charge pump 158. By changing the amount of delay, the feedback loop corrects the duty cycle of output clock 114 to a desired value (e.g., 50% or about 50%).

XOR gate 190 serves as a clock doubler. Specifically, it accepts as one input signal 182A (buffered reference clock 112), and output signal 192 (delayed reference clock 112). XOR gate 190 doubles the frequency of reference clock 112 by performing an exclusive-OR operation on its two input signals.

In other words, at its output, XOR gate 190 provides a signal with twice the frequency of reference clock 112. As persons of ordinary skill in the art who have the benefit of the description of the disclosed concepts understand, one may use other circuits to double the frequency of reference clock 112, as desired.

LPF 152 accepts the output signal of XOR gate 190 via inverters 196 and 198. LPF 152 includes resistor 200 (R) and capacitor 202 (C). The product RC determines the location of the pole of the transfer function of LPF 152. As persons of ordinary skill in the art who have the benefit of the description of the disclosed concepts understand, one may use other types or configurations of filter, as desired.

Comparator 156 accepts as one input output signal 152A of LPF 152. As another input, comparator 156 accepts output signal 154A of reference-voltage generator 154. Comparator 156 drives charge pump 158.

Reference-voltage generator 154 employs a resistor divider that includes resistor 155A and resistor 155B. Capacitor 155C acts as a decoupling capacitor, and stabilizes the output of reference-voltage generator 154.

In one embodiment, resistor 155A and resistor 155B have equal resistor values (i.e., signal 154A has a magnitude of $V_{CC}/2$), which corrects the duty cycle of output clock 114 to 50% or about 50%. By using other resistor values, one may correct the duty cycle of output clock 114 to values other than 50%, as persons of ordinary skill in the art who have the benefit of the description of the disclosed concepts understand.

Using the resistor divider as reference-voltage generator 154 provides signal 154A independently of temperature. In other words, assuming a reasonably good match in the temperature coefficients of resistor 155A and resistor 155B, the resistances of the two resistors change uniformly or nearly uniformly with temperature. Consequently, the output voltage of reference-voltage generator 154 remains independent of temperature variations. Note that rather than using a resistor divider, one may use a variety of other circuits to implement reference-voltage generator 154, as desired.

Control signal generator 206 derives control signals for transistors in controllable delay 170, as described below in detail. Transmission gate 172, transmission 174, and capacitor 210 allow initialization of the feedback loop in the frequency doubler. Capacitor 210 allows setting the location of the dominant pole of the feedback loop.

As noted, transmission gate 172 and transmission gate 174 facilitate enabling and initialization of the feedback loop in the frequency doubler. Specifically, signal 176 and signal 178 constitute enable signals that control transmission gate 172 and transmission gate 174. Transmission gate 172 and transmission gate 174 allow charging capacitor 210 to a known voltage (under the control of signal 176 and signal 178) before enabling the circuit.

Thus, with the circuit disabled, transmission gate 172 is enabled and capacitor 210 charged to the operating voltage of the capacitor. With the circuit enabled, transmission gate 174 is enabled, and the output of charge pump 158 charges or discharges capacitor 210, depending on circuit conditions.

Figure 5:
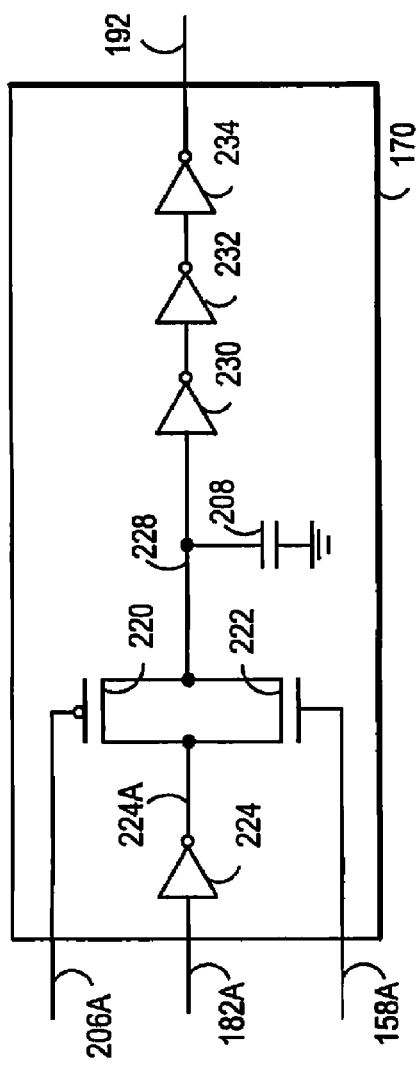
FIG. 5 illustrates a simplified circuit schematic of a controllable delay according to an exemplary embodiment.

FIG. 5 illustrates a simplified circuit schematic of controllable delay 170. Controllable delay 170 includes inverters 224, 230, 232, and 234; PMOS transistor 220; NMOS transistor 222; and capacitor 208. Inverters 224, 230, 232, and 234 provide inversion and buffering of various signals.

PMOS transistor 220 and NMOS transistor 222 form a transmission gate. Output signal 158A of charge pump 158 (see FIG. 4) drives the gate of NMOS transistor 222. Output signal 206A of control signal generator 206 (see FIG. 4), drives the gate of PMOS transistor 220.

Output signal 182A of inverter 182 (see FIG. 4), i.e., a buffered version of reference clock 112, drives the input of the transmission gate formed by PMOS transistor 220 and NMOS transistor 222. In response to control signals 158A and 206A, the resistance of transistors 220 and 222 varies. Thus, based on control signals 158A and 206A, the transmission gate provides a varying proportion of reference clock 112 to capacitor 208 as output signal 228.

Put another way, the varying resistance of the transmission gate and the capacitance of capacitor 208 provide a delay whose value varies based on control signals 158A and 206A. Consequently, by varying the control signals 158A and 206A, the feedback loop (see FIGS. 3 and 4) changes the duty cycle of output clock 114 to a desired value (e.g., 50% or about 50%). As persons of ordinary skill in the art who have the benefit of the description of the disclosed concepts understand, one may implement controllable delay 170 using other circuits and topologies, as desired.

Figure 6:
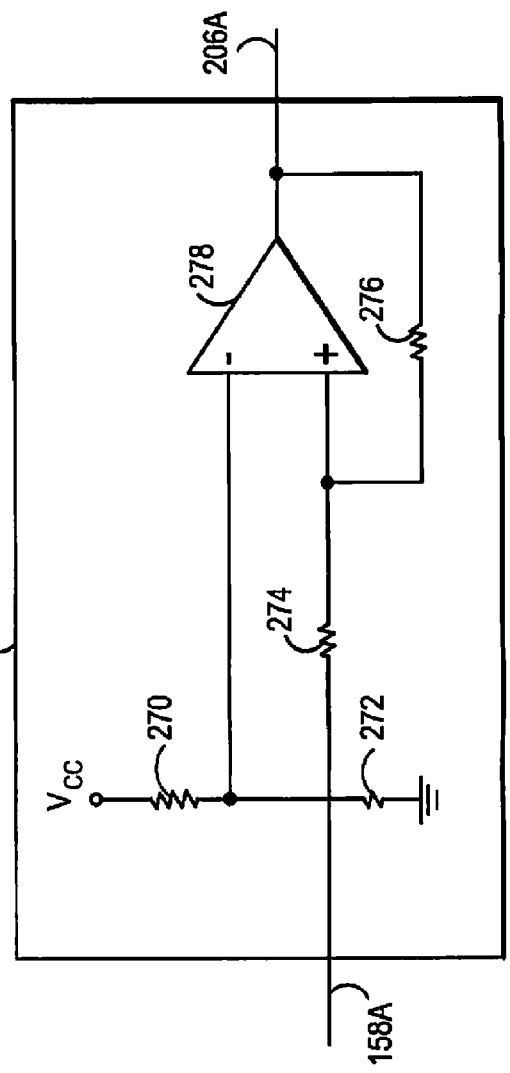
FIG. 6 depicts a simplified schematic of a control voltage generator according to an exemplary embodiment.

FIG. 6 depicts a simplified schematic of control voltage generator 206. Control voltage generator 206 includes operational amplifier 278, and resistors 270, 272, 274, and 276. Control voltage generator 206 derives control voltage 206A from control voltage 158A (i.e., the output of charge pump 158A). As noted above, control voltages 158A and 206A drive the gates of transistors in a transmission gate in controllable delay 170 (see FIG. 4).

As persons of ordinary skill in the art who have the benefit of the description of the disclosed concepts understand, by using specific values of resistors 270, 272, 274, and 276. In one exemplary embodiment, one may choose the values of resistors 270, 272, 274, and 276 so that control signal 206A constitutes the difference between control signal 158A (output signal of charge pump 158) and the supply voltage, $V_{CC}$. As persons of ordinary skill in the art who have the benefit of the description of the disclosed concepts understand, one may implement control signal generator 206 using other circuitry and topologies, as desired.

Figure 7:
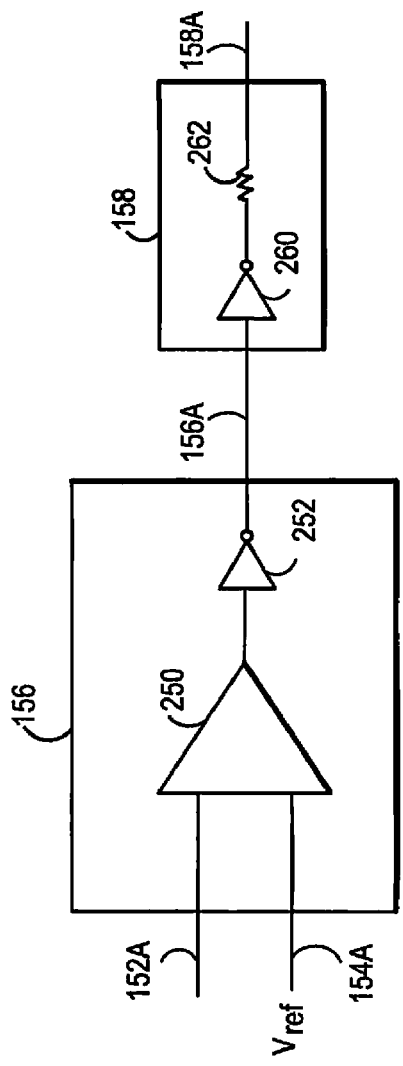
FIG. 7 shows a simplified schematic of a comparator and a charge pump according to exemplary embodiments.

FIG. 7 shows a simplified schematic of comparator 156 and charge pump 158. Comparator 156 includes difference amplifier (or comparator) 250, which compares signal 152A (output signal of LPF 152) and signal 154A (output signal of reference-voltage generator 154) to provide an output signal to inverter 252. Inverter 252 provides inversion and buffering functions, and provides compare signal 156A to charge pump 158.

Charge pump 158 includes inverter 260 and resistor 262, coupled in a cascade configuration. Based on output signal 156A of comparator 156, inverter 260 charges and discharges capacitor 160 (see FIGS. 3 and 4) through resistor 262. Put another way, inverter 260 acts as a charge pump.

The product of the resistance of resistor 262 and the capacitance of capacitor 160 determines the location of the dominant pole of the feedback loop. In exemplary embodiments, the dominant pole has a location at least 10 times below the bandwidth of LPF 152. Note, however, that one may use other pole locations, as desired. Note further that, as persons of ordinary skill in the art who have the benefit of the description of the disclosed concepts understand, one may implement comparator 156 and charge pump 158 using other circuits and topologies, as desired.

Figure 8:
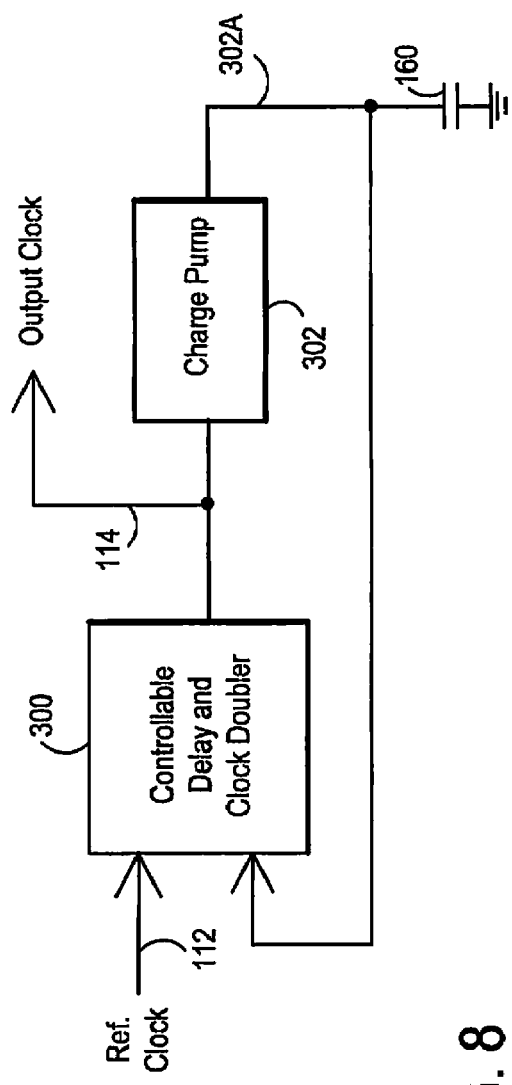
FIG. 8 shows a simplified block diagram of a clock doubler according to an exemplary embodiment.

FIG. 8 shows a simplified block diagram of a clock doubler 104B according to another exemplary embodiment. Clock doubler 104B includes controllable delay and clock doubler 300, charge pump 302, and capacitor 160.

As an examination of FIG. 8 shows, the illustrated clock doubler has relatively few circuit blocks and components. As a result, it occupies a smaller chip area, consumes less power, and provides improved duty-cycle performance. In simulations, an exemplary embodiment based on FIG. 8 and configured to correct duty cycle to 50% provided a 90-degree phase margin, evidencing stability of the feedback loop. Furthermore, the embodiment provided duty-cycle performance of 50%±1.5% (i.e., about 50% or substantially 50%).

Controllable delay and clock doubler 300 and charge pump 302 operate in a negative-feedback loop. The feedback loop provides the capability for clock doubler 104B to correct the duty cycle of output clock 114 to 50% or about 50%.

In response to reference clock 112 and output signal 302A of charge pump 302, controllable delay and clock doubler 300 generates output clock 114. Output clock 114 has double the frequency of reference clock 112, and a corrected duty cycle (50% or about 50%).

Output clock 114 drives charge pump 302. In response, charge pump 302A generates signal 302A, which charges or discharges capacitor 160. Signal 302A also feeds back to controllable delay and clock doubler 300, thus closing the feedback loop.

Signal 302A causes controllable delay and clock doubler 300 to generate a delayed version of reference clock 112, with the amount of delay dependent on the magnitude of signal 302A. Put another way, signal 302A charges or discharges capacitor 160, depending on whether the duty cycle of output clock 114 is less than or greater than 50% (or about 50%). Thus, similar to the embodiments discussed above, by causing the amount of delay to vary, the negative feedback loop causes correction of the duty cycle of output clock 114.

Figure 9:
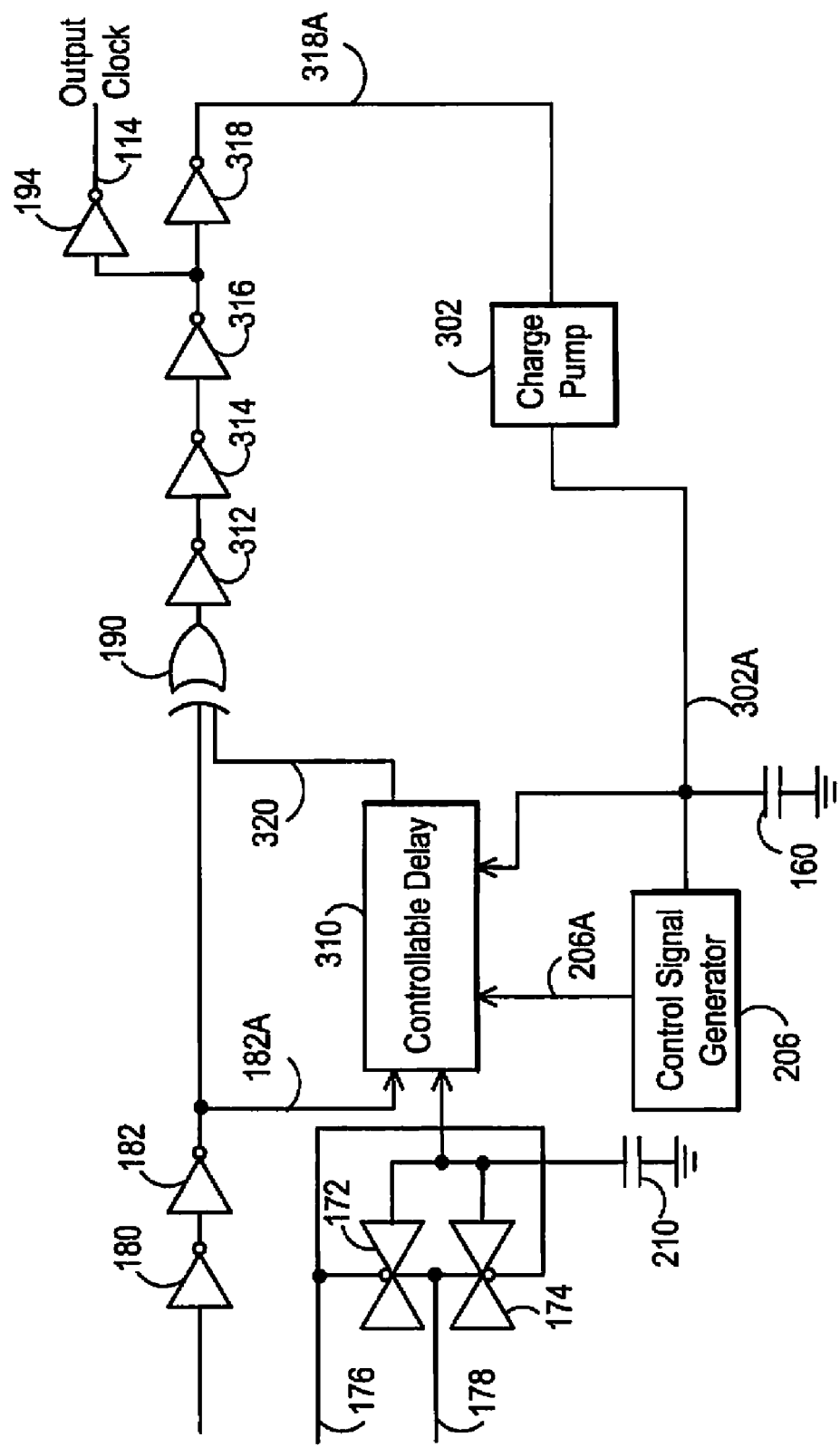
FIG. 9 illustrates a more detailed schematic of a clock doubler according to an exemplary embodiment.

FIG. 9 shows more details of a clock doubler according to an exemplary embodiment. Specifically, FIG. 9 provides more details of the circuitry of clock doubler 104B.

The clock doubler in FIG. 9 includes controllable delay 310, XOR gate 190, charge pump 302, and control signal generator 206. In addition, the clock doubler includes a number of inverters (labeled as 180, 182, 194, 312, 314, 316, and 318) that provide buffering and inversion for various signals.

Controllable delay 310 (described below in detail) accepts a buffered version (i.e., the output signal 182A of inverter 182) of reference clock 112. As described above, controllable delay 310 provides a delayed version of signal 182A (i.e., of reference clock 112), and provides that delayed version as output signal 320. Also as noted above, the amount of delay depends on a control signal in the negative feedback loop that includes controllable delay 310, XOR gate 190, and charge pump 302. By changing the amount of delay, the feedback loop corrects the duty cycle of output clock 114 to 50% or about 50%.

XOR gate 190 serves as a clock doubler. Specifically, it accepts as one input signal 182A (buffered reference clock 112), and output signal 320 (delayed reference clock 112). XOR gate 190 doubles the frequency of reference clock 112 by performing an exclusive-OR operation on its two input signals.

In other words, at its output, XOR gate 190 provides a signal with twice the frequency of reference clock 112. As persons of ordinary skill in the art who have the benefit of the description of the disclosed concepts understand, one may use other circuits to double the frequency of reference clock 112, as desired.

Control signal generator 206 derives control signals for transistors in controllable delay 310, as described below in detail. Transmission gate 172, transmission 174, and capacitor 210 allow initialization of the feedback loop in the frequency doubler. As described above, capacitor 210 allows setting the location of the dominant pole of the feedback loop. Furthermore, transmission gate 172 and transmission gate 174 facilitate enabling and initialization of the feedback loop in the frequency doubler, as described above with respect to FIG. 4.

Figure 10:
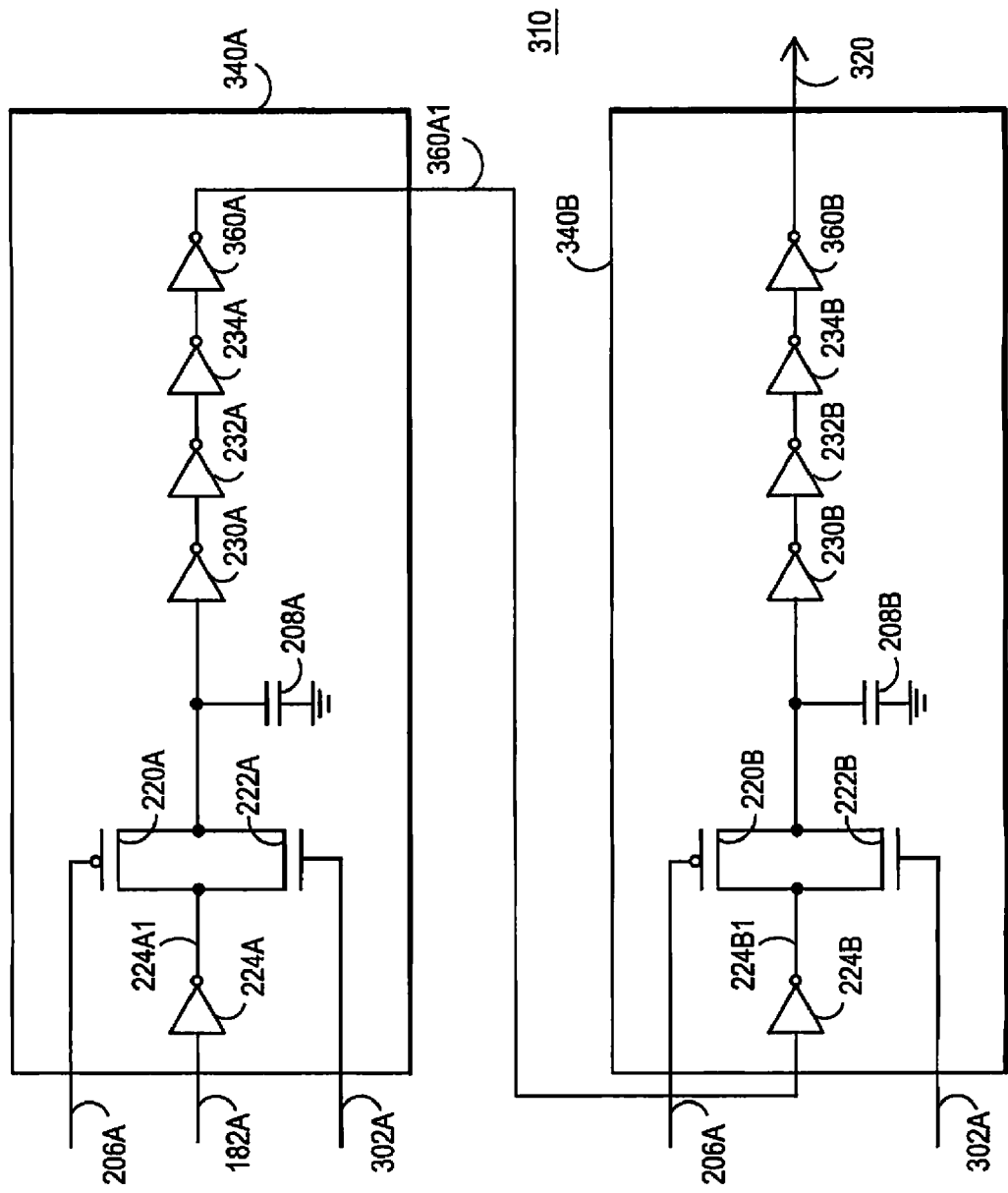
FIG. 10 depicts a simplified circuit schematic of a controllable delay according to an exemplary embodiment.

FIG. 10 illustrates a simplified circuit schematic of controllable delay 310. Controllable delay 310 includes two delay cells or circuits 340A and 340B, coupled in a tandem or cascade configuration. Delay cell 340A and delay cell 340B have the same configuration and circuit elements, and operate in a similar manner.

Implementing controllable delay 310 in this manner provides a controllable delay independent of mismatch between the PMOS and NMOS transistors, described below in detail. This desirable property is achieved by propagating reference clock 112 through identical delay cells twice, each time with opposite transition polarity.

Delay cell 340A includes inverters 224A, 232A, 234A, and 360A; PMOS transistor 220A; NMOS transistor 222A; and capacitor 208A. Inverters 224A, 23A, 232A, 234A, and 360A provide inversion and buffering of various signals. Delay cell 340B includes inverters 224B, 232B, 234B, and 360B; PMOS transistor 220B; NMOS transistor 222B; and capacitor 208B, which operate in a manner similar to that of their respective counterparts in delay cell 340A.

Referring to delay cell 340A, PMOS transistor 220A and NMOS transistor 222A form a transmission gate. Output signal 302A of charge pump 302 (see FIG. 9) drives the gate of NMOS transistor 222A. Output signal 206A of control signal generator 206 (FIGS. 6 and 9), drives the gate of PMOS transistor 220A.

Output signal 182A of inverter 182 (see FIG. 9), i.e., a buffered version of reference clock 112, drives the input of the transmission gate formed by PMOS transistor 220A and NMOS transistor 222A. In response to control signals 302A and 206A, the resistance of transistors 220A and 222A varies. Thus, based on control signals 302A and 206A, the transmission gate provides a varying proportion of reference clock 112 to capacitor 208.

Put another way, the varying resistance of the transmission gate and the capacitance of capacitor 208 provide a delay whose value varies based on control signals 302A and 206A. Consequently, by varying the control signals 302A and 206A, the feedback loop (see FIGS. 8 and 9) changes the duty cycle of output clock 114 to 50% or about 50%.

Output 360A of delay cell 340A drives the input of delay cell 340B. As a result, delay cell 340B generates output signal 320, which drives one input of XOR gate 190 (see FIG. 9). As persons of ordinary skill in the art who have the benefit of the description of the disclosed concepts understand, one may implement controllable delay 310 using other circuits and topologies, as desired.

Figure 11:
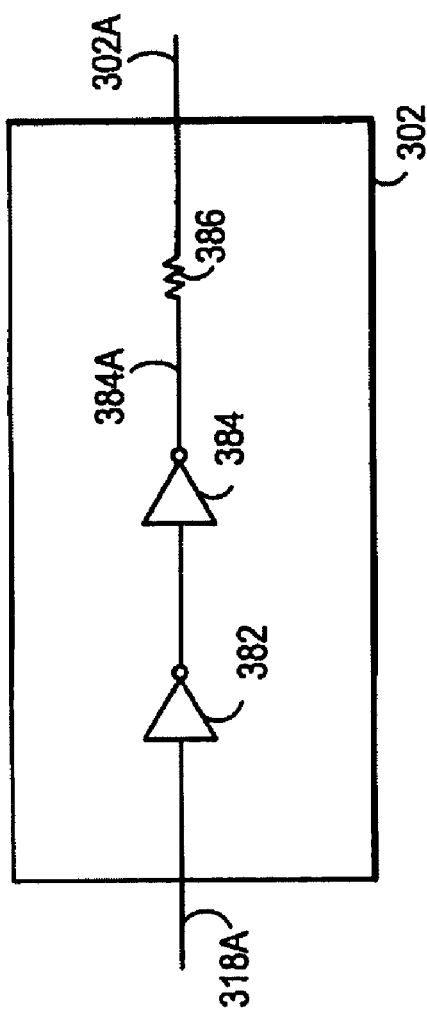
FIG. 11 shows a simplified schematic of a charge pump according to an exemplary embodiment.

FIG. 11 shows a simplified schematic of charge pump 302. Charge pump 302 includes inverters 382 and 384; and resistor 386. Charge pump 302 buffers signal 318A (see FIG. 9) to generate control signal 384A at the output of inverter 384. Control signal 384A charges or discharges capacitor 160 (see FIG. 9), depending on whether the duty cycle of output clock 114 is less than or greater than 50% (or about 50%).

Specifically, in response to the voltage present across capacitor 160, controllable delay and clock doubler 310 (see FIG. 9) generates a delayed version of reference clock 112. The amount of delay depends on the magnitude of control signal 384A. Put another way, variations in control signal 384A cause changes in the amount of delay produced by controllable delay and clock doubler 310. Because of the application of negative feedback, controllable delay and clock doubler 320 the amount of delay that causes correction of the duty cycle of output clock 114.

Figure 12:
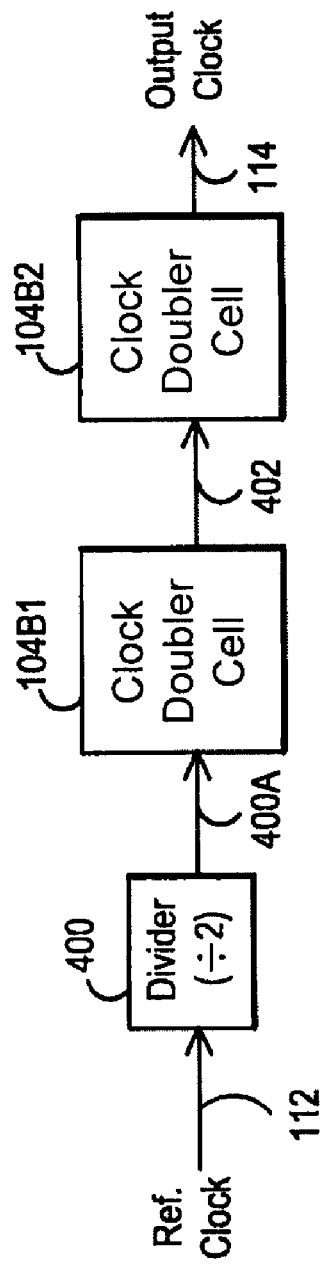
FIG. 12 illustrates a simplified block diagram of a clock doubler according to an exemplary embodiment.

FIG. 12 illustrates a simplified block diagram of a clock doubler 104C according to an exemplary embodiment. Clock doubler 104C includes divider 400, and two instances of clock doubler 104B (see FIGS. 8 and 9) coupled in a cascade or tandem arrangement, and labeled as clock doubler cells 104B1 and 104B2, respectively.

Divider 400 accepts reference clock 112, and divides it by two to generate clock signal 400A. Put another way, the frequency of clock signal 400A is half of the frequency of reference clock 112. The division operation causes clock signal 400A to have a duty cycle of 50% (or about 50%), but half the frequency of reference clock 112.

Clock doubler cell 104B1 doubles the frequency of clock signal 400A to generate clock signal 402. By virtue of the frequency-doubling operation of clock doubler cell 104B1, clock signal 402 has twice the frequency of clock signal 400A, or the same frequency as reference clock 112.

Clock doubler cell 104B2 doubles the frequency of clock signal 402 to generate output clock 114. By virtue of the frequency-doubling operation of clock doubler cell 104B2, output clock 114 has twice the frequency of clock signal 402, or twice the frequency of reference clock 112. Furthermore, output clock 114 has a duty cycle of 50% (or about 50%).

As an examination of FIG. 12 shows, the illustrated clock doubler has relatively few circuit blocks and components. As a result, it occupies a smaller chip area, consumes less power, and provides improved duty-cycle performance. In simulations, an exemplary embodiment based on FIG. 12 and configured to correct duty cycle to 50% provided a 90-degree phase margin, evidencing stability of the feedback loop. Furthermore, the embodiment provided duty-cycle performance of 50%±3% (i.e., about 50% or substantially 50%).

Figure 13:
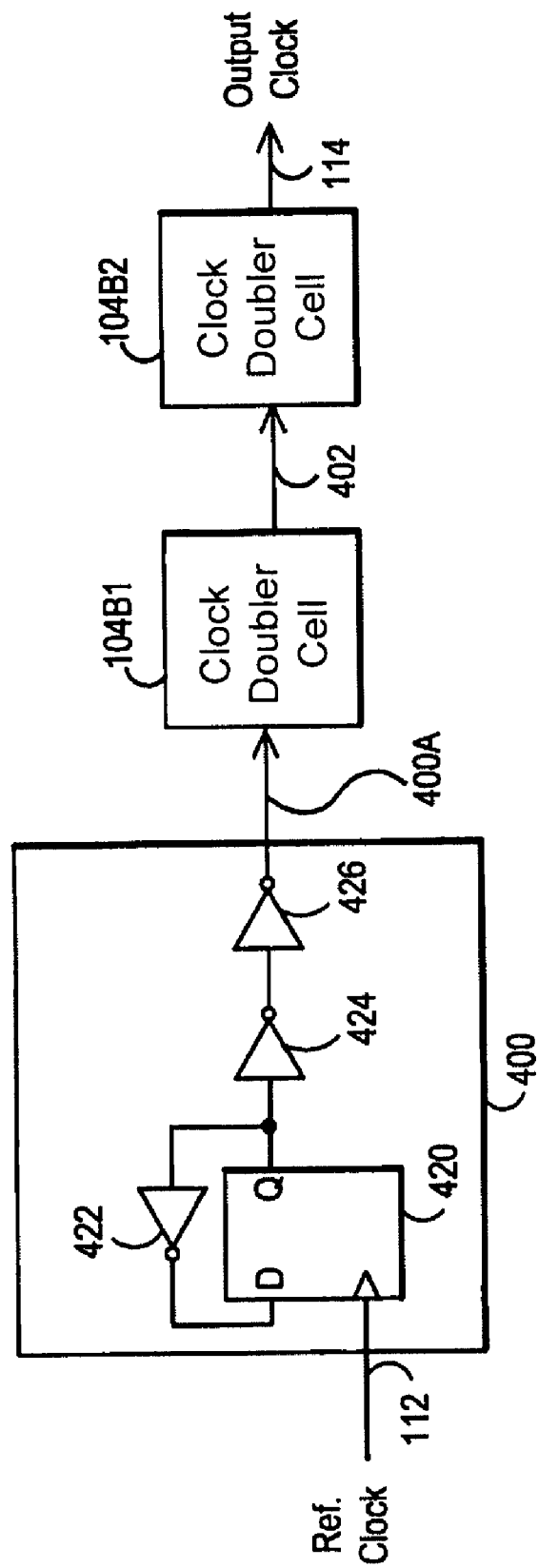
FIG. 13 depicts a more detailed block diagram of the clock doubler of FIG. 12.

FIG. 13 depicts a more detailed block diagram of the clock doubler of FIG. 12. Specifically, FIG. 13 provides a simplified schematic of a divider according to an exemplary embodiment.

Referring to FIG. 13, divider 400 includes D flip-flop 420, and inverters 422, 424, and 426. Reference clock 112 clocks flip-flop 420. Inverter 422 inverts the Q output of flip-flop 420, and provides the resulting signal to the D input of flip-flop 420. (Note that, rather than using inverter 422, one may feed back the Q' output of flip-flop 420 to the D input, if flip-flop 420 has a complementary output.)

The circuit arrangement in divider 400 causes the frequency of the output signal of flip-flop 420 to be half of the frequency of reference clock 112. Inverters 424 and 426 buffer the signal at the Q output of flip-flop 420 to generate clock signal 400A. As noted above, clock signal 400A drives clock doubler cell 104B1.

Figure 14:
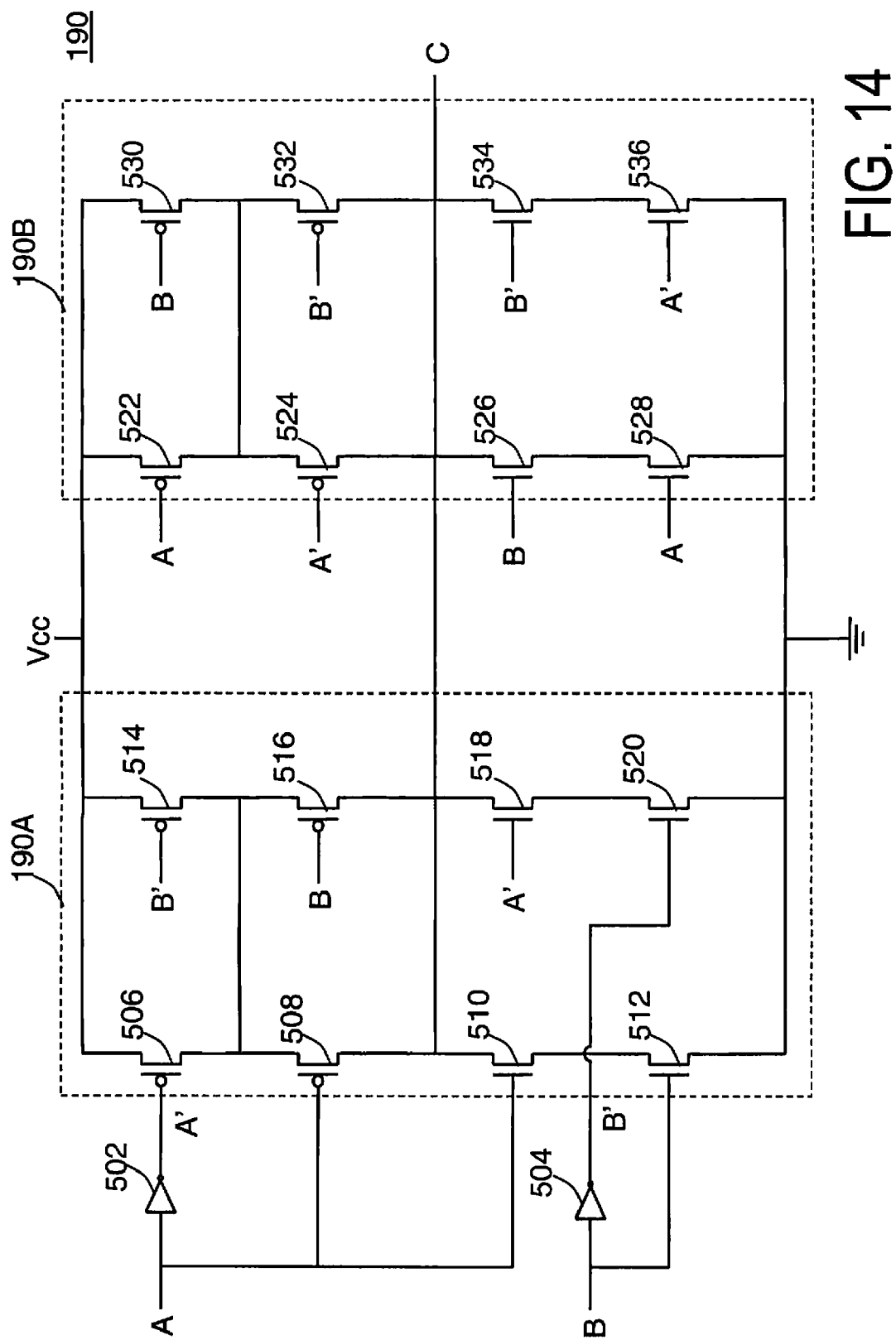
FIG. 14 shows a simplified schematic of an exclusive-OR (XOR) gate according to an exemplary embodiment.

FIG. 14 shows a simplified schematic of exclusive-OR (XOR) gate 190 according to an exemplary embodiment. The figure assumes that XOR gate 190 has two inputs (labeled A and B). At its output (labeled C), XOR gate 190 provides the exclusive-OR of inputs A and B, i.e., C=A⊕B.

The embodiment of XOR gate 190 shown in FIG. 14 avoids glitches in output clock 114. Specifically, the output rise and fall times of this embodiment of XOR gate 190 are independent (or substantially independent) of the rise and fall times of inputs A and B.

XOR gate 190 accepts input signal A and input signal B, and generates an output signal C. Output signal C constitutes the results of an exclusive-OR operation performed on input signal A and input signal B, i.e., C=A⊕B.

XOR gate 190 includes two circuits (labeled as 190A and 190B) arranged in a tandem or cascade configuration, and inverters 502 and 504. Inverter 502 generates a complement of input signal A, i.e., signal A'. Conversely, inverter 504 produces a complement of input signal B, i.e., signal B'.

Circuit 190A and circuit 190B have the same topology, and operate in a similar manner, although in response to different input signals. Circuit 190A includes transistors 506-520. As persons of ordinary skill in the art who have the benefit of the description of the disclosed concepts understand, circuit 190A constitutes an XOR gate. Circuit 190B includes transistors 522-536, and also operates as an XOR gate.

Corresponding transistors or groups of transistors in circuit 190A and circuit 190B, however, operate in response to differing input signals. For example, transistor 506 and transistor 508 in circuit 190A respond to input signal A and signal A', respectively. On the other hand, the corresponding transistors in circuit 190B (i.e., transistor 522 and transistor 524) respond to input signal A' and signal A, respectively (i.e., the reverse of the position of the two signals for transistor 506 and transistor 508).

The tandem configuration of circuit 190A and circuit 190B, together with the staggering of the signal combinations that drive respective transistor combinations, causes XOR gate 190 to produce output signal C with rise and fall times that are independent (or substantially independent) of the rise and fall times of input signals A and B. This property of the output rise and fall times facilitates the duty-cycle correction of the embodiments described above.

As persons of ordinary skill in the art who have the benefit of the description of the disclosed concepts understand, one may apply the disclosed concepts effectively in a wide variety of signal processing and conditioning applications. Examples described in this document (communication/application processors) constitute merely illustrative applications, and are not intended to limit the application of the disclosed concepts to other applications by making appropriate modifications, as appropriate. Those modifications fall within the knowledge and level of skill of persons of ordinary skill in the art who have the benefit of the description of the disclosed concepts.

Referring to the figures, persons of ordinary skill in the art will note that the various blocks shown may depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of this disclosure understand. Other modifications and alternative embodiments in addition to those described here will be apparent to persons of ordinary skill in the art who have the benefit of this disclosure. Accordingly, this description teaches those skilled in the art the manner of carrying out the disclosed concepts and are to be construed as illustrative only.

The forms and embodiments shown and described should be taken as the presently preferred or illustrative embodiments. Persons skilled in the art may make various changes in the shape, size and arrangement of parts without departing from the scope of the disclosure described in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

The invention claimed is:

1. An apparatus, comprising:
  a controllable delay circuit that generates a delayed clock signal from a reference clock signal;
  a clock doubler circuit that generates an output clock signal from the delayed clock signal, wherein a frequency of the output clock signal is twice a frequency of the reference clock signal;

a low-pass filter that receives the output clock signal and generates a filtered signal; and a comparator that generates an output signal by comparing the filtered signal with a reference signal.

2. The apparatus according to claim 1, wherein the reference signal has a voltage equal to half a supply voltage of the apparatus.

3. The apparatus according to claim 1, further comprising a charge pump circuit that receives the output signal and provides a feedback signal to the controllable delay circuit.

4. The apparatus according to claim 3, wherein the feedback signal causes charging or discharging of a capacitor coupled to the charge pump circuit.

5. The apparatus according to claim 1, further comprising a reference-signal generator that provides the reference signal.

6. The apparatus according to claim 5, wherein the reference-signal generator comprises a resistor divider.

7. The apparatus according to claim 1, wherein the controllable delay circuit and the clock doubler circuit are coupled in a feedback loop.

8. The apparatus according to claim 7, wherein a duty cycle of the output clock signal is corrected by the feedback loop.

9. The apparatus according to claim 8, wherein the duty cycle of the output clock signal is corrected to fifty-percent.

10. The apparatus according to claim 8, wherein the duty cycle of the output clock signal is corrected to substantially fifty-percent.

11. An apparatus, comprising:
a controllable delay circuit that generates a delayed clock signal from a reference clock signal; and
a clock doubler circuit that generates an output clock signal from the delayed clock signal,
wherein a frequency of the output clock signal is twice a frequency of the reference clock signal, and
wherein the controllable delay circuit comprises a transmission gate coupled to a capacitor.

12. The apparatus according to claim 11, wherein a resistance of the transmission gate varies according to a feedback signal.

13. An apparatus, comprising:
a first frequency-doubler circuit, comprising:
a first controllable delay circuit that generates a first delayed clock signal from a first input clock signal; and
a first clock doubler circuit that generates a first output clock signal from the first delayed clock signal, the first output clock signal having a frequency that is twice a frequency of the first input clock signal; and
a first charge pump that provides a first feedback signal to the first controllable delay circuit in response to the first delayed clock signal.

14. The apparatus according to claim 13, wherein a duty cycle of the first output clock signal is corrected by the first feedback signal.

15. The apparatus according to claim 14, wherein the duty cycle of the first output clock signal is corrected to fifty-percent.

16. The apparatus according to claim 14, wherein the duty cycle of the first output clock signal is corrected to substantially fifty-percent.

17. The apparatus according to claim 13, wherein the first controllable delay circuit comprises:
a first transmission gate coupled to accept the first input clock signal; and
a first capacitor coupled to the first transmission gate.

18. The apparatus according to claim 17, wherein the first controllable delay circuit further comprises:
a second transmission gate coupled to the first capacitor; and
a second capacitor coupled to the second transmission gate.

19. The apparatus according to claim 13, wherein the first charge pump comprises:
a first inverter; and
a first resistor coupled to the first inverter,
wherein the first inverter charges or discharges a third capacitor in response to the first output clock signal.

20. The apparatus according to claim 13, wherein the first clock doubler circuit comprises a first exclusive-OR (XOR) gate.

21. The apparatus according to claim 13, further comprising:
a second frequency-doubler circuit, comprising:
a second controllable delay circuit that generates a second delayed clock signal from the first output clock signal; and
a second clock doubler circuit that generates a second output clock signal from the second delayed clock signal, the second output clock signal having a frequency that is twice a frequency of the first output clock signal; and
a second charge pump that provides a second feedback signal to the second controllable delay circuit in response to the second delayed clock signal.

22. The apparatus according to claim 21, further comprising a frequency divider circuit that accepts a reference clock signal and generates the first input clock signal, wherein a frequency of the first input clock signal is half a frequency of the reference clock signal.

23. The apparatus according to claim 21, wherein a duty cycle of the second output clock signal is corrected by the second feedback signal.

24. The apparatus according to claim 23, wherein the duty cycle of the second output clock signal is corrected to fifty-percent.

25. The apparatus according to claim 23, wherein the duty cycle of the second output clock signal is corrected to substantially fifty-percent.

26. The apparatus according to claim 21, wherein the second controllable delay circuit comprises:
a third transmission gate coupled to accept the first output clock signal; and
a fourth capacitor coupled to the third transmission gate.

27. The apparatus according to claim 26, wherein the second controllable delay circuit further comprises:
a fourth transmission gate coupled to the first capacitor; and
a fifth capacitor coupled to the fourth transmission gate.

28. The apparatus according to claim 21, wherein the second charge pump comprises:
a second inverter; and
a second resistor coupled to the second inverter,
wherein the second inverter charges or discharges a sixth capacitor in response to the second output clock signal.

29. The apparatus according to claim 21, wherein the second clock doubler circuit comprises a second exclusive-OR (XOR) gate.

30. A method of generating an output clock signal from a reference clock signal, the method comprising:
delaying the reference clock signal to generate a delayed clock signal; and
generating the output clock signal by using the delayed clock signal in a negative feedback loop, wherein a frequency of the output clock signal is twice a frequency of the reference clock signal, and wherein generating the output clock signal further comprises using an exclusive-OR gate driven by the delayed clock signal and the reference clock signal.

31. The method according to claim 30, further comprising correcting a duty cycle of the output clock signal by using the negative feedback loop.

32. The method according to claim 31, wherein correcting a duty cycle of the output clock signal further comprises correcting the duty cycle of the output clock signal to fifty percent.

33. The method according to claim 31, wherein correcting a duty cycle of the output clock signal further comprises correcting the duty cycle of the output clock signal to substantially fifty percent.

34. A method of generating an output clock signal from a reference clock signal, the method comprising:

delaying the reference clock signal to generate a delayed clock signal; and generating the output clock signal by using the delayed clock signal in a negative feedback loop, wherein a frequency of the output clock signal is twice a frequency of the reference clock signal, and wherein generating the output clock signal further comprises comparing a signal derived from the delayed clock signal with a reference signal to generate a compare signal.

35. The method according to claim 34, further comprising using the compare signal to control the feedback loop.

* * * * *